United States Patent [19]
Yao et al.

[11] Patent Number: 5,929,430
[45] Date of Patent: Jul. 27, 1999

[54] COUPLED OPTO-ELECTRONIC OSCILLATOR

[75] Inventors: X. Steve Yao, Diamond Bar; Lute Maleki, Pasadena, both of Calif.

[73] Assignee: California Institute of Technology, Pasadena, Calif.

[21] Appl. No.: 08/937,892

[22] Filed: Sep. 25, 1997

Related U.S. Application Data

[60] Provisional application No. 60/035,565, Jan. 14, 1997.

[51] Int. Cl.$^6$ .............................. H01S 3/098; G02F 1/03
[52] U.S. Cl. .................... 250/205; 250/227.11; 359/181; 359/184; 359/187; 359/245
[58] Field of Search ............................. 250/205, 227.11, 250/227.12, 227.17, 227.18, 227.21, 214.1, 214 R; 372/12, 18; 359/181, 184, 187, 245, 315, 316, 317, 318, 319, 320

[56] References Cited

U.S. PATENT DOCUMENTS

| | | | |
|---|---|---|---|
| 3,569,715 | 3/1971 | Horning | 359/161 |
| 4,700,150 | 10/1987 | Hall et al. | 359/279 |
| 4,796,264 | 1/1989 | Suzuki | 372/29 |
| 5,265,111 | 11/1993 | Chesnoy et al. | 372/32 |
| 5,343,324 | 8/1994 | Le et al. | 359/184 |
| 5,379,309 | 1/1995 | Logan, Jr. | 372/18 |
| 5,400,417 | 3/1995 | Allie et al. | 385/2 |
| 5,495,359 | 2/1996 | Gertel et al. | 359/245 |
| 5,532,857 | 7/1996 | Gertel et al. | 359/154 |
| 5,717,627 | 2/1998 | Mizushima | 365/112 |
| 5,723,856 | 3/1998 | Yao et al. | 250/227.11 |
| 5,777,778 | 7/1998 | Yao | 359/245 |

OTHER PUBLICATIONS

Smith, Mode Selection in Lasers, Apr. 1972, Proceedings in the IEEE, vol. 60,, No. 4.

A. Neyer and E. Voges, Hybrid Electro–Optical Multivibrator Operating By Finite Feedback Delay, Jan. 21, 1982, *Electronics Letters*.

H.M. Gibs, F.A. Hopf, D.L. Kaplan, M.W. Derstine, R.L. Shoemaker, Periodic Oscillations and Chaos in Optical Bistability: Possible Guided–Wave All–Optical Square–Wave Oscillators, 1981, *SPIE* vol. 317.

A. Neyer and E. Voges, High–Frequency Electro–Optic Oscillator Using an Integrated Interferometer, Jan. 1, 1982, *Appl. Phys. Lett.* 40(1).

A. Neyer and E. Voges, Nonlinear Electrooptic Oscillator Using an Integrated Interferometer, May 1, 1981 *Optics Communications* vol. 37, No. 3.

A. Neyer and E. Voges, Dynamics of Electrooptic Bistable Devices with Delayed Feedback, Dec. 1982, *IEEE Journal of Quantum Electronics*, vol. QE–18, No. 12.

H.F. Schlaak and R.Th. Kersten, Integrated Optical Oscillators and Their Applications to Optical Communication Systems, *Optics Communications* vol. 36, No. 3.

Tahito Aida and Peter Davis, Oscillation Modes of Laser Diode Pumped Hybrid Bistable System with Large Delay and Application to Dynamical Memory, Mar. 1992, *IEEE Journal of Quantum Electronics*, vol. 28, No. 3.

X. Steve Yao and Lute Maleki, Optoelectronic Microwave Oscillator, Aug. 1996, *J. Opt. Soc. Am. B*/vol. 13, No. 8.

(List continued on next page.)

*Primary Examiner*—Edward P. Westin
*Assistant Examiner*—John R. Lee
*Attorney, Agent, or Firm*—Fish & Richardson P.C.

[57] ABSTRACT

A coupled opto-electronic oscillator that directly couples a laser oscillation with an electronic oscillation to simultaneously achieve a stable RF oscillation at a high frequency and ultra-short optical pulsation by mode locking with a high repetition rate and stability. Single-mode selection can be achieved even with a very long opto-electronic loop. A multimode laser can be used to pump the electronic oscillation, resulting in a high operation efficiency. The optical and the RF oscillations are correlated to each other.

57 Claims, 14 Drawing Sheets

OTHER PUBLICATIONS

X. Steve Yao and George Lutes, A High–Speed Photonic Clock and Carrier Recovery Device, May 1996, *IEEE Photonics Technology Letters*, vol. 8, No. 5.

X. Steve Yao and Lute Maleki, Converting Light Into Spectrally Pure Microwave Oscillation, Apr. 1, 1996, *Optics Letters* vol. 21, No. 7.

X. Steve Yao and Lute Maleki, Optoelectronic Oscillator for Photonic Systems, Apr. 7, 1996, *IEEE Journal of Quantum Electronics*, vol. 32, No. 7.

X.S. Yao and L. Maleki, High Frequency Optical Subcarrier Generator, Apr. 21, 1994, *Electronics Letters Online* No.: 19941033.

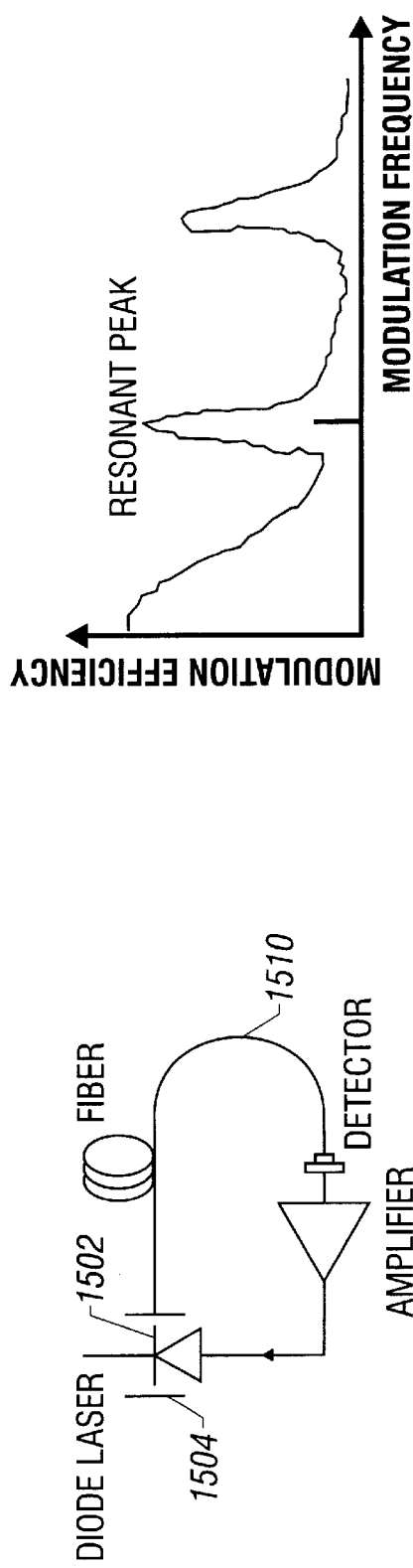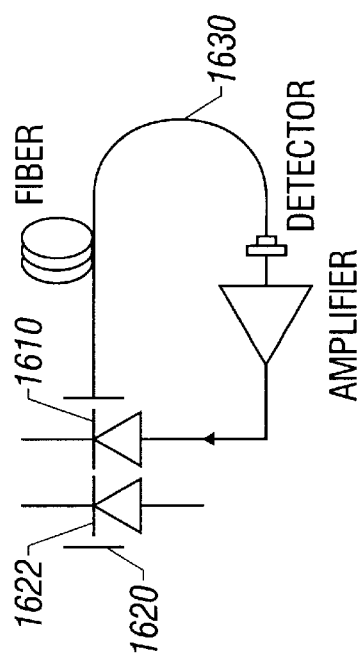

COUPLED OPTO-ELECTRONIC OSCILLATOR

This application claims the benefit of the U.S. Provisional Application No. 60/035,565 filed on Jan. 14, 1997, the entirety of which is incorporated herein by reference.

ORIGIN OF THE INVENTION

The invention described herein was made in the performance of work under a NASA contract, and is subject to the provisions of Public Law 96-517 (35 U.S.C. 202) in which the Contractor has elected to retain title.

FIELD OF THE INVENTION

The present invention relates to electro-optic devices and light sources for photonic systems.

BACKGROUND OF THE INVENTION

Opto-electronic systems may implement one or more feedback loops to achieve certain operational characteristics. For example, some single-frequency lasers use a passive feedback loop to correct drifts in the laser frequency to achieve a stabilized output frequency. A typical feedback loop of this type has a photosensor to convert a fraction of the laser output into an electrical signal and a device to generate a benchmark frequency to which the laser frequency is locked. A non-zero error signal is generated by the feedback loop to control the laser if the laser frequency deviates from the benchmark frequency.

A regeneratively mode-locked laser is another example of an opto-electronic system with a passive feedback loop. In a regeneratively mode-locked laser, a mode beat signal from a laser is detected by a photodetector in the feedback loop. The signal is subsequently amplified and fed back to modulate the laser. A bandpass filter may be used to filter the signal in the feedback loop. The feedback loop is usually passive and not self-oscillating. Another aspect is that the stability of the laser is dependent on the laser cavity itself and is essentially independent of the feedback loop. In addition, the stability of the mode beating signal is almost entirely determined by the laser cavity. See, for example, Nakazawa et al., "Ultrastable Harmonically and Regeneratively Modelocked Polarisation-Maintaining Erbium Fibre Ring Laser", Electronics Letters, Vol. 30, No. 19, pp. 1603–1605, Sep. 15, 1994; Nakazawa and Yoshida, "Direct Generation of a 750fs, 10 GHz Pulse Train from A Regeneratively Mode-Locked Fibre Laser with Multiple harmonic modulation", Electronics Letters, Vol. 32, No. 14, pp. 1291–1293, Jul. 4, 1996; and Kinsel, "A Stabilized Mode-Locked Nd:YAlG Laser Using Electronic Feedback", IEEE Journal of Quantum Electronics, Vol. QE-9, No. 1, pp. 3–8, January, 1973.

In addition to passive feedback loops, an active opto-electronic feedback loop with an open-loop gain less than unity may also be used in an opto-electronic system. Such an active feedback loop not only can provide a feedback to alter the operation of the system but also can generate and sustain an electromagnetic oscillation in the loop.

An opto-electronic oscillator ("OEO") has one or multiple active feedback loops to generate both optical modulation and electrical oscillation in radio frequency spectrum. An OEO usually has an electro-optic modulator pumped by a laser and at least one active opto-electronic feedback loop which provides in-phase feedback to an RF input port of an electro-optic light modulator. The open loop gain in the loop is greater than unity in order to generate an RF electrical oscillation therein. The pump laser is usually a single-mode laser. The continuous photon energy from the laser is converted into RF or microwave signals by the feedback loop.

The feedback loop in an OEO can be electrical and/or optical in nature, allowing both signal output and signal injection in either electrical or optical format or a combination thereof. An OEO is capable of producing spectrally pure RF oscillations with excellent stability, frequency tunability and low phase noise. The high performance and adaptability for both optical and electrical domains make OEOs suitable to a variety of applications for photonic communication and data processing systems. Detailed information on opto-electronic oscillators can be found, for example, in U.S. Pat. No. 5,723,856 issued on Mar. 3, 1998 for a single-loop OEO by Yao and Maleki, and U.S. Pat. No. 5,777,778 issued on Jul. 7, 1998 for a multiple-loop OEO by Yao.

SUMMARY OF THE INVENTION

The present disclosure provides a Coupled Opto-Electronic Oscillator ("COEO") that directly couples a laser oscillation of an optical feedback system to an electrical oscillation of an opto-electronic feedback system. The laser oscillation and the electrical oscillation are intimately correlated with each other so that both the modes and stability of one oscillation are coupled with another oscillation.

In accordance with one embodiment of the invention, a coupled opto-electronic oscillator has two mutually coupled oscillation systems, a laser oscillator and an opto-electronic feedback oscillator. The laser oscillator includes an internal active optical feedback loop with a gain medium to effect a first loop gain greater than unity and is responsive to an electrical signal. The laser oscillator produces a coherent optical oscillation. The opto-electronic feedback oscillator is essentially an active opto-electronic feedback loop coupled to the laser oscillator and receives an optical signal from the output of the laser oscillator which is indicative of the optical oscillation.

The opto-electronic feedback loop includes an optical delay element for producing a delay, a photodetector responsive to intensity variation of input optical signals for converting the optical signal from the optical delay element into an electrical modulation signal and an electrical interface with the laser oscillator to feed electrical modulation signal to the gain medium which modulates the optical gain in the optical feedback loop.

Furthermore, the opto-electronic feedback loop has a second loop gain greater than unity to generate and sustain an electrical oscillation therein. One aspect of the invention is that a specific relation between the loop length of the optical feedback loop in the laser oscillator and the loop length of the opto-electronic feedback loop is necessary so as to make both optical and electrical oscillations stable.

Other elements may be implemented in the opto-electronic feedback loop, which include but are not limited to, an RF amplifier, a variable electrical delay element, a bandpass RF filter, a variable RF attenuator, an RF coupler, and an optical coupler.

One advantage of the invention is that the COEO can be self-oscillating without an external pump laser, although an external laser may be used in a COEO. Therefore, a coupled opto-electronic oscillator can be used to conveniently accomplish single-mode selection with ease even for a system having a very long opto-electronic feedback loop.

In addition, a multimode laser can be used with an COEO to pump the electronic oscillation, and to achieve in an efficient operation and reduced manufacturing cost.

Furthermore, the COEO can provide a link between the optical and the microwave oscillations, which can be further used for simultaneously generating stable optical pulses and a continuous microwave oscillating signal (e.g., sinusoidal wave).

BRIEF DESCRIPTION OF THE DRAWINGS

These and other features and advantages of the present invention will become more apparent in light of the following detailed description of preferred embodiments thereof, as illustrated in the accompanying drawings, in which:

FIG. 15A illustrates a COEO with a diode laser with a short cavity as the optical loop in accordance with the present invention.

FIG. 15B shows the modulation efficiency as a function of the modulation frequency of the system in FIG. 15A.

FIG. 16 shows a COEO with an optical cavity having a semiconductor gain medium and an electro-absorption modulator.

DETAILED DESCRIPTION OF THE INVENTION

Figure 1:
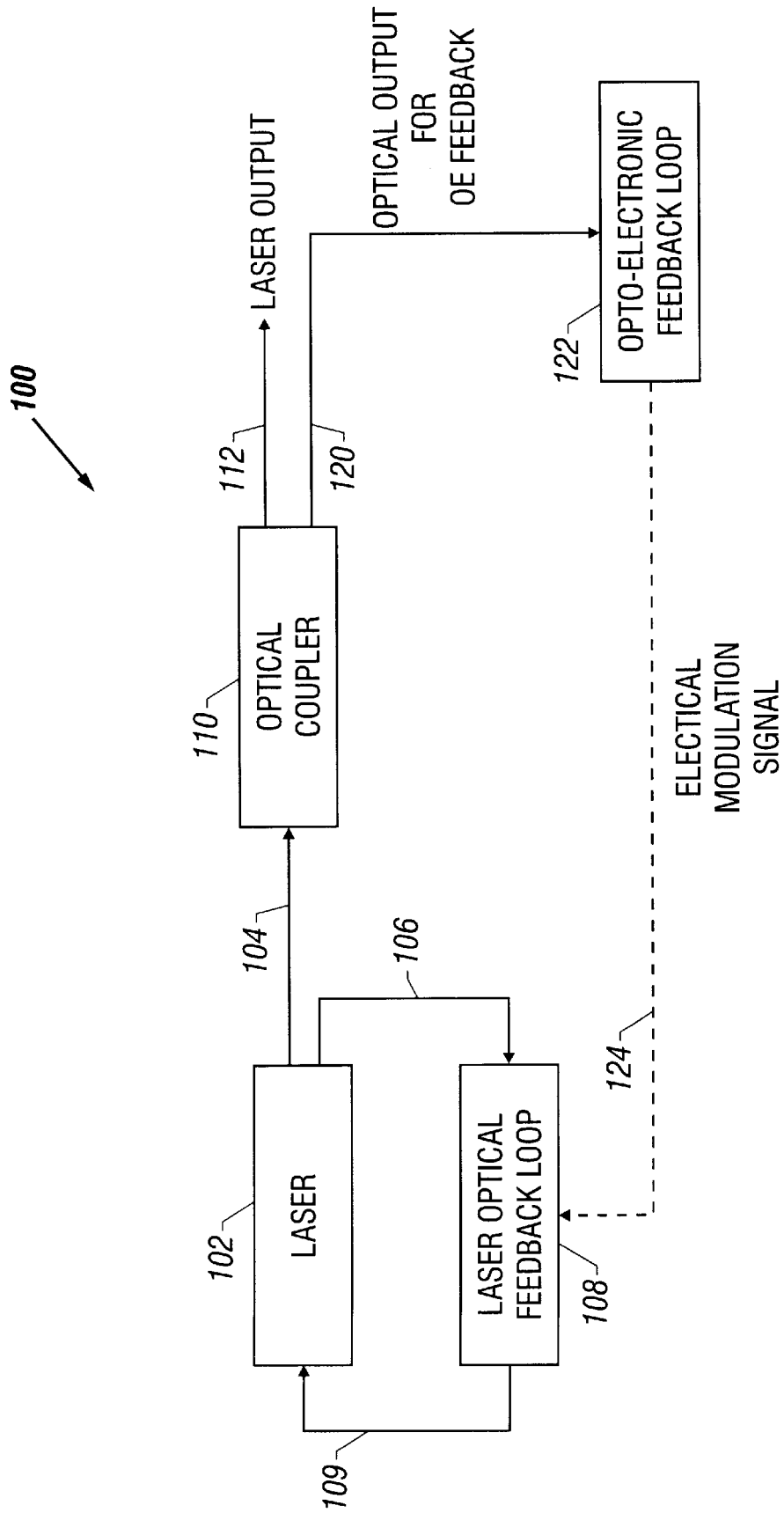
FIG. 1 is a block diagram of a preferred embodiment of the present invention.

FIG. 1 schematically shows one embodiment 100 of a coupled opto-electronic oscillator. A laser 102 has an internal optical feedback loop 104 which forms a laser resonator. The optical feedback loop 104 is responsive to external electrical signals to change the characteristics of the optical feedback in the laser 102. An optical output 106 of the laser 102 is split into a laser output 112 of the system 100 and an optical output 120 to an opto-electronic feedback loop 122. This is preferably done with an optical coupler 110. The opto-electronic feedback loop 122 converts optical signal 120 into an electrical modulation signal 124 that is fed to the optical feedback loop 104 of the laser 102.

The laser 102 may be selected from a variety of lasers in either a single-mode configuration or multimode configuration. A multimode solid-state laser, a diode laser or a diode-pumped laser may be used to achieve good operation reliability, compact system packaging, and reduced cost. The laser 102 may be energized by an electrical power supply such as in a diode laser or in a laser with a semiconductor optical amplifier. Alternatively, optically-pumped lasers may be used as the laser 102.

The optical feedback loop 104 preferably has at least one electro-optical element that receives the electrical signal 124 and thereby alters characteristics of the optical feedback in the laser 102 including the loop gain and the phase of the feedback signal. One example of such an electro-optical element is an electrically-controlled laser gain medium.

The opto-electronic feedback loop 122 includes an optical delay element to induce a desired phase delay and a photodetector to convert optical signal 120 into electrical form. The photodetector preferably has a fast response speed to accommodate high frequency oscillations. Other elements may also be included in the opto-electronic loop 122, such as an RF amplifier, a variable electrical delay element, a bandpass RF filter, and an RF coupler.

The opto-electronic loop 122 preferably has a delay that is much larger than the delay in the optical loop 104. This results in a mode spacing in loop 122 smaller than the mode spacing in the optical loop 104 of the laser 102 and facilitates both frequency tunability and single-mode selection.

Both the optical loop 104 and the opto-electronic loop 122 respectively have a preferred open loop gain greater than unity. Therefore, the optical loop 104 generates an laser oscillation and the opto-electronic loop 122 generates an RF opto-electronic oscillation that is directly coupled to the laser 102.

In particular, the loop length of the optical feedback loop 104 in the laser 102 is preferably adjusted relative to the loop length of the opto-electronic feedback loop 122 so that one of the laser cavity modes of the loop 104 matches one of the RF modes allowable in the loop 122 at a desired RF frequency. This preferred condition facilitates the stability of both the optical and RF oscillations.

The operation and advantages of the preferred embodiment 100 is now described with reference to a special system based on a ring laser. It should be understood that the special system is used herein as an example of the preferred embodiment 100. One skilled in the art should realize that the particularities in the special system should not be construed as limitations of the preferred embodiment 100. Various system configurations and corresponding components may be chosen and optimized for a particular application to achieve a desired performance.

Figure 2:
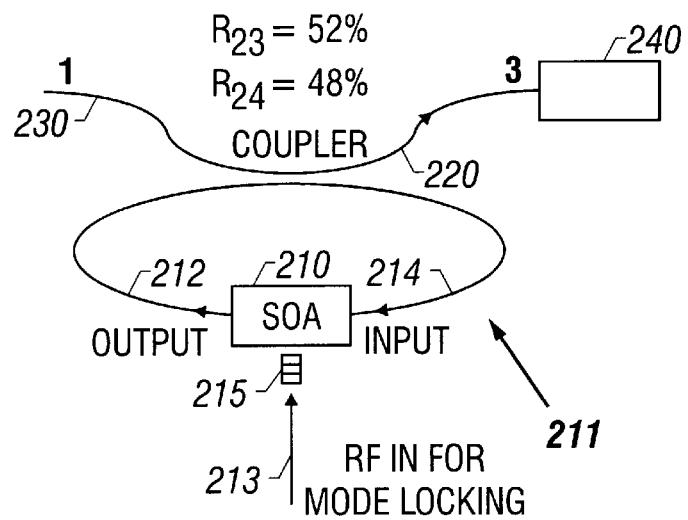
FIG. 2 illustrates an example of the suitable lasers that can be used in practicing the present invention.

FIG. 2 shows a ring laser 200 used in the special system. The ring laser 200 includes a semiconductor optical amplifier (SOA) 210 and an optical fiber loop 211 with a first half 212 connected to the output terminal of the SOA 210 and a second half 214 connected to the input terminal of the SOA 210. The SOA 210 has an electrical power supply and a semiconductor gain medium in a desirable lasing spectral range. The SOA 210 operates based on generation of population inversion between two energy levels in the gain medium by electrical excitation. An RF port 215 in the SOA 210 is used for feeding an external electrical signal 213 to modulate the gain of the amplifier, SOA 210. One SOA that may be implemented in practicing the invention is a 1300-nm unidirectional multiple-quantum-well SOA, which is disclosed by Tiemeijer et al., "27-dB Gain Unidirectional 1300-nm Polarization-Insensitive Multiple Quantum Well Laser Amplifier Module", IEEE Photonics Technology Letters, Vol. 6, No. 12, pp. 1430–1432, December, 1994.

Alternatively, a doped fiber amplifier may be used to replace the SOA 210 in FIG. 2.

The inventors used a custom-made SOA from E-Tek Dynamics Corporation for testing the ring laser 200. The E-Tek SOA has a small signal gain around 15 dB peaked at about 1298 nm and has an optical isolator with an isolation of about 30 dB. A 3 dB optical coupler 220 with an excess loss of about 0.5 dB was used to construct the ring laser 200. A power meter 240 was used to receive and measure the coupled laser output from the coupler 220. The coupling efficiencies from the output 212 of the SOA 210 to the power meter 240 and the input 214 of the SOA 210 were about 52% and 48%, respectively.

Figure 3:
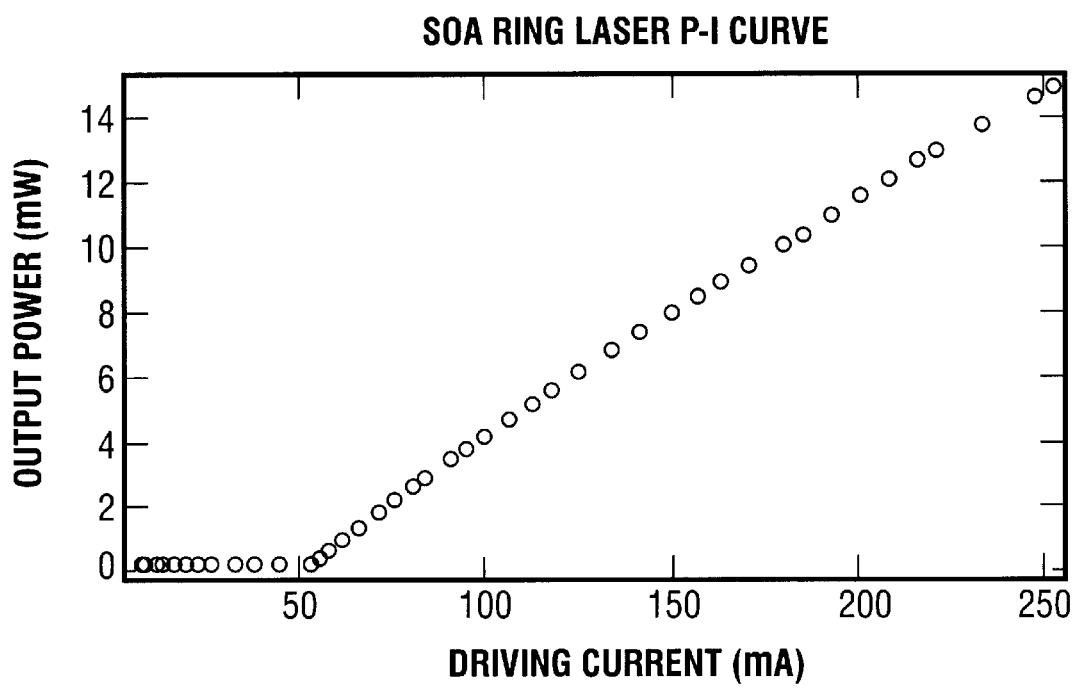
FIG. 3 shows measured output power of the ring laser in FIG. 2 as a function of driving current applied to the semiconductor optical amplifier.

A measured power vs. driving current curve is shown in FIG. 3. The data shows that the ring laser 200 has a threshold for the driving current at about 50 mA and a slope efficiency of about 0.16 W/A. The output power reached approximately 15 mW with a driving current of about 253.6 mA.

The ring laser 200 in general may have many longitudinal modes that oscillate simultaneously in the optical loop (i.e., multi-mode operation). The mode spacing is determined by the loop length of the ring formed by fiber 211 and SOA 210 (e.g., laser cavity). The measured mode spacing is around 23.3 MHZ, corresponding to a loop length of about 8.58 meters.

Figure 4A:
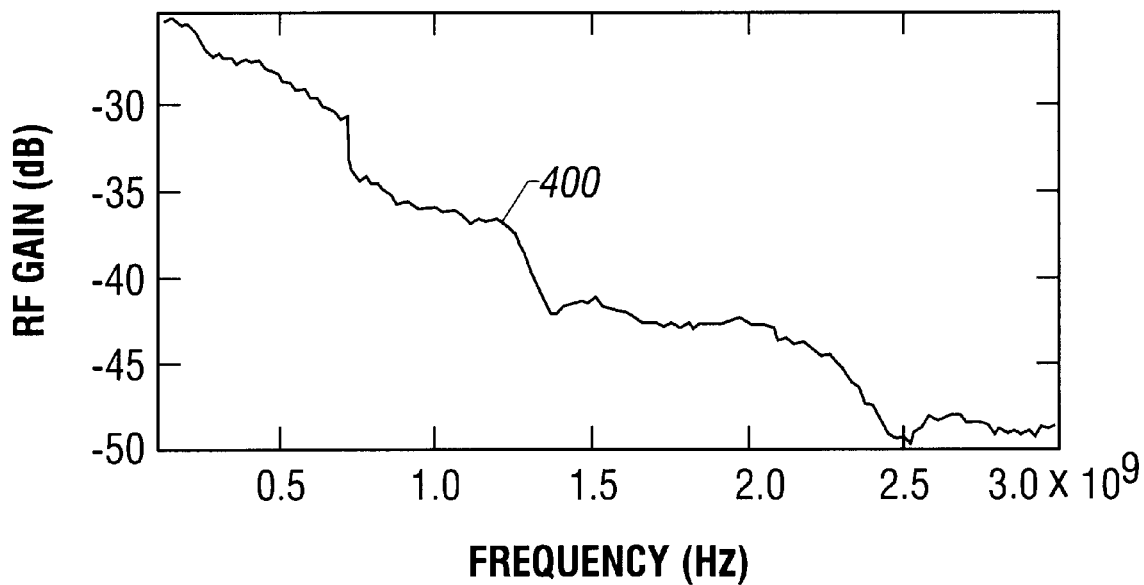
FIG. 4A is a chart showing the measured RF spectral response of the semiconductor optical amplifier.
Figure 4B:
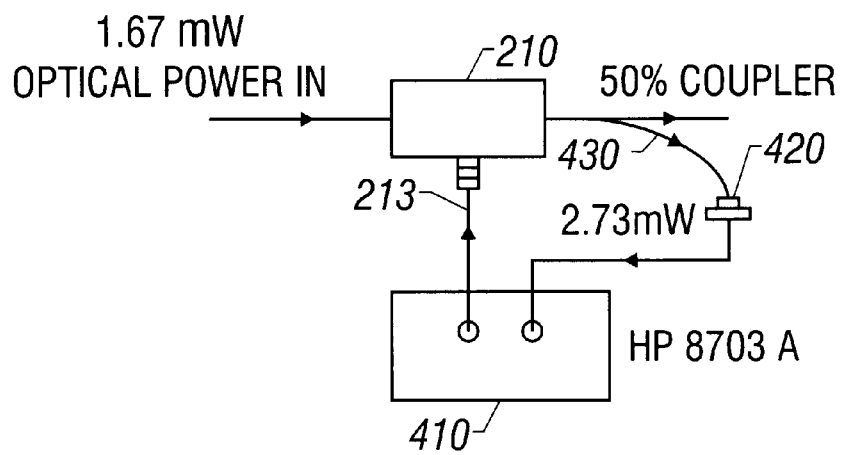
FIG. 4B shows the test setup for measuring the RF spectral response of the semiconductor optical amplifier used in the ring laser of FIG. 2.

FIG. 4A shows the RF response of the E-Tek SOA 210 which was measured with a HP optical network analyzer 410 with a setup illustrated in FIG. 4B. The optical gain of the SOA 210 was modulated by an RF signal from the optical network analyzer 410. An optical coupler 430 was used to split a portion of the output power from the SOA 210 to a photodetector 420. An electrical signal from the photodetector 420 is fed to the optical network analyzer 410 for measurements.

Mode locking of the ring laser 200 was achieved by injecting an RF signal 213 that has a frequency equal to the mode spacing or a multiple of mode spacing of the ring laser 200. Without the RF signal 213 driving the SOA 210, the phases of the longitudinal modes in the ring laser 200 are independent of one another and the output of the laser 210 is a CW output with random power fluctuations caused by the interference of the modes. In contrast, with the RF signal 213 driving the SOA 210, each mode in the laser 200 is modulated. If the driving frequency of the modulation signal 213 is substantially equal to the mode spacing or a multiple of the mode spacing of the laser 200, the sidebands of each modulated mode will coincide with its neighboring bands, causing injection-lock of its neighboring bands with itself in phase. This results in an pulsed output of the ring laser 200 in the time domain. After the mode locking is established, the actual mode spacing of the laser 200 is equal to the frequency of the external RF driving signal 213, which is the multiple of the fundamental mode spacing of the ring laser.

Figure 5A:
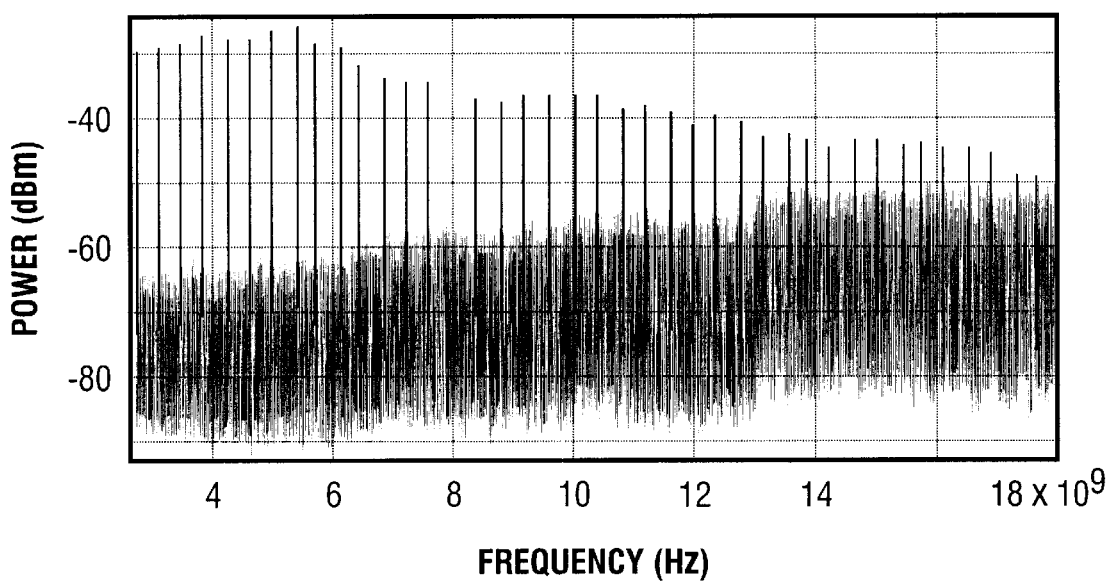
FIGS. 5A and 5B show data for mode beating spectrum and a detailed spectral features of one line of the mode-locked ring laser of FIG. 2, respectively.

FIG. 5A shows the RF spectrum of the mode-locked ring laser 200. The data was measured with a photodetector and an RF spectrum analyzer. The peaks of the RF spectrum result from the beating between the longitudinal modes in the ring laser 200. The lowest frequency corresponds to the beat between any two neighboring modes and the second lowest frequency corresponds to the beat between every other modes, and so on.

Figure 5B:
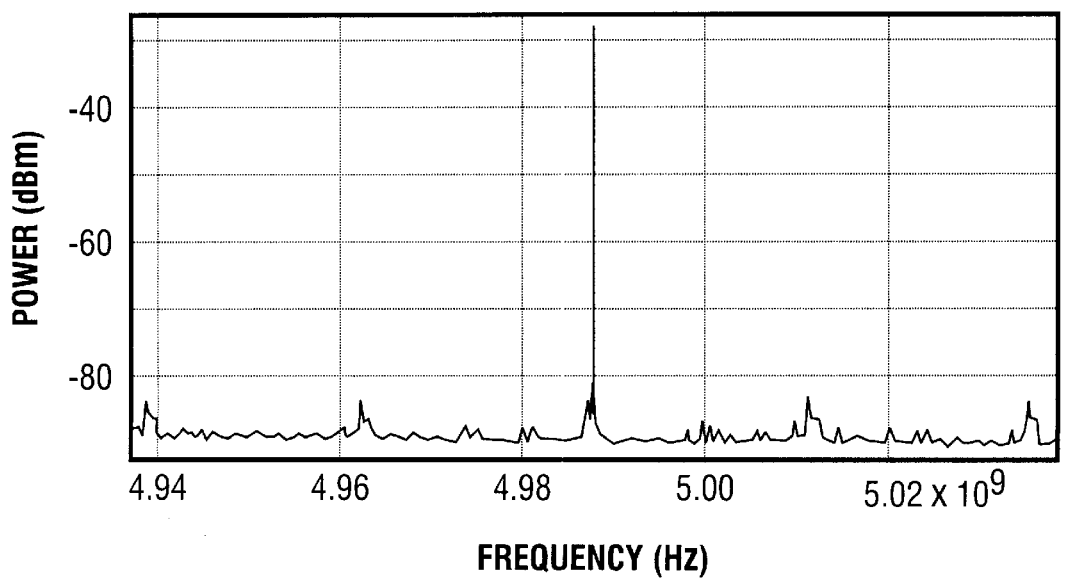

FIG. 5B shows the spectrum of a specific mode of the mode-locked ring laser 200. In the experiment, the RF driving signal had a frequency at about 383.692 MHZ and a power at about 14 dBm. Because the mode locking frequency is much larger than the natural mode spacing of the ring laser 200, many of the natural modes were suppressed. However, the residual traces of these modes are still visible in FIG. 5B.

Figure 5C:
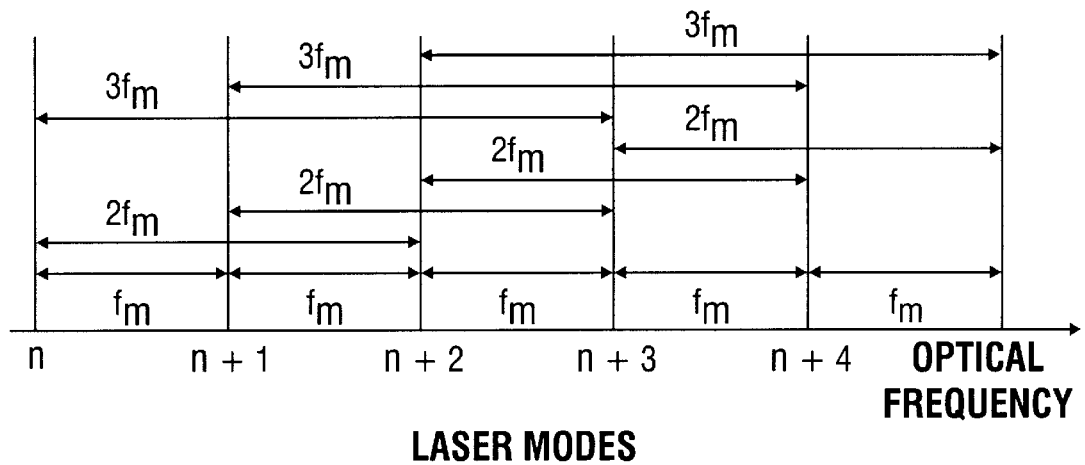
FIG. 5C is a diagram showing the mode beating signals in the optical loop at the first three possible RF frequencies caused by interference of different laser modes.
Figure 5D:
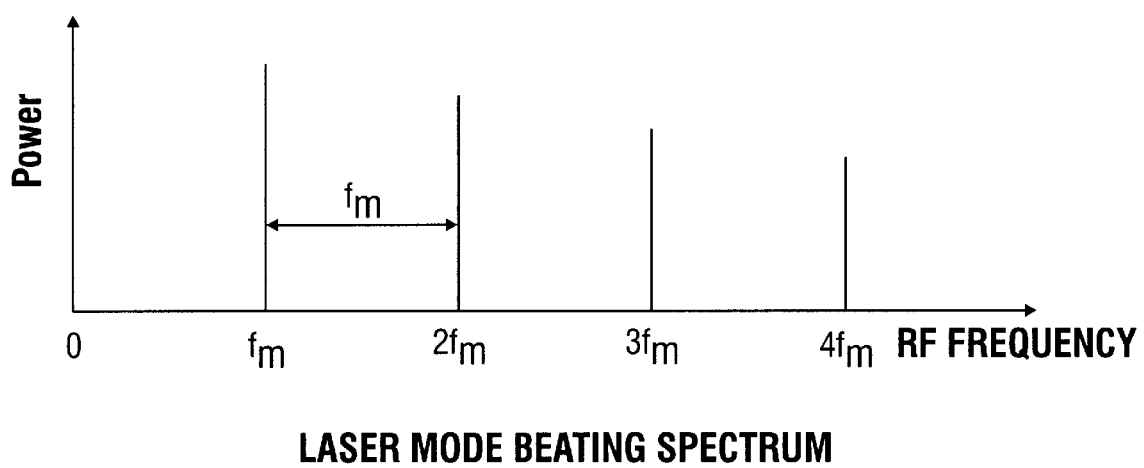
FIG. 5D is a chart showing a mode beating spectrum of the optical loop with a RF feedback at fm.

The mode beating spectrum shown in FIG. 5A of a mode locked laser may be understood with the illustration of FIGS. 5C and 5D. FIG. SC shows the mode beating signals in the optical loop at the first three possible RF frequencies caused by interference of different laser modes. The possible natural laser modes have a mode spacing $\Delta v = c/nL$, where L is the round trip loop length and n is the refractive index of the optical loop, respectively. When the laser output is detected by a power-law device, such as a photodetector, these modes will interfere with each other and produce mode beating signals. The summation of all the interferences between any two neighboring modes produces a beat signal at a RF frequency of $f_m = \Delta v$:

$$P(\Delta v) \propto \sum_{j}^{N-1} A_j A_{j+1} \exp[i\Delta vt + \phi_j(t) - \phi_{j+1}], \quad (1)$$

where $A_j$ and $\phi_j(t)$ are the amplitude and phase of jth mode, and N is the number of all permissible laser natural modes in the optical loop. Similarly, the summation of all the interferences between every other modes produces a beat signal at a RF frequency of $2f_m = 2\Delta v$:

$$P(2\Delta v) \propto \sum_{j}^{N-2} A_j A_{j+2} \exp[i\Delta vt + \phi_j(t) - \phi_{j+2}]. \quad (2)$$

In general, the summation of all the interferences between every nth mode produces a beat signal at a RF frequency of $nf_m = n\Delta v$:

$$P(n\Delta v) \propto \sum_{j}^{N-n} A_j A_{j+n} \exp[i\Delta vt + \phi_j(t) - \phi_{j+n}]. \quad (3)$$

When the laser is not mode locked, the relative phases of different laser modes are random and fluctuating with time. Consequently, the summation of Eq. (3) for each n yields a small and fluctuating signal. However, when the laser is mode locked, all modes are in phase with respect to one another so that the energy in each of the summed modes is added constructively and the resultant summation field becomes stable. This action produces strong and stable mode beating signals in the optical loop as shown in FIG. 5D.

Therefore, only when the laser is mode locked, the strong and stable mode beating spectrum could be observed. The total number of participating modes in a summation is (N−n), which decreases with n. On the other hand, the mode beating frequency is proportional to n. Hence, the higher the mode beating frequency, the fewer participants contributing to the signal and the weaker the signal. This phenomenon is believed by the inventors to explain why the signal level decreases with the mode beating frequency as shown by FIG. 5A.

Figure 6A:
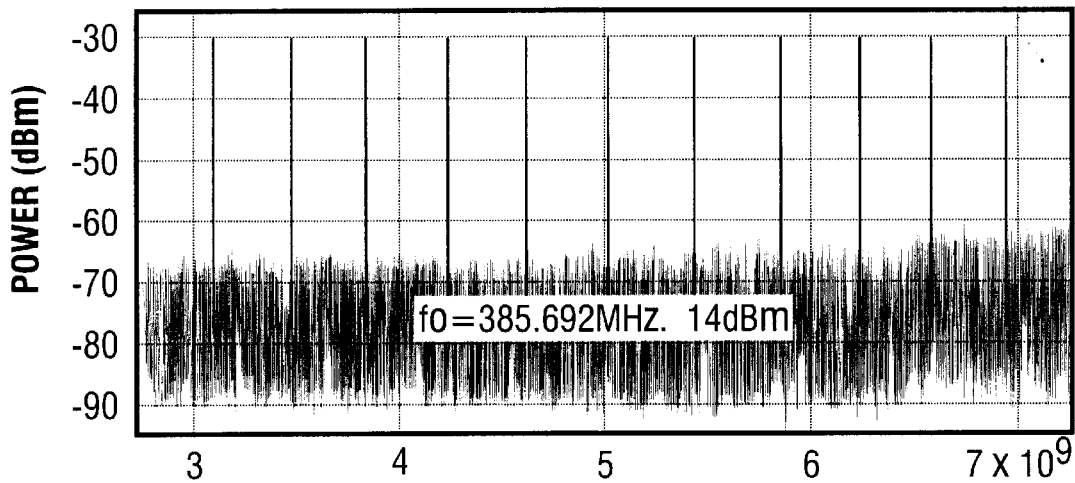
FIGS. 6A, 6B and 6C further show the mode beating spectra of the mode-locked ring laser of FIG. 2 at different mode-locking frequencies.
Figure 6B:
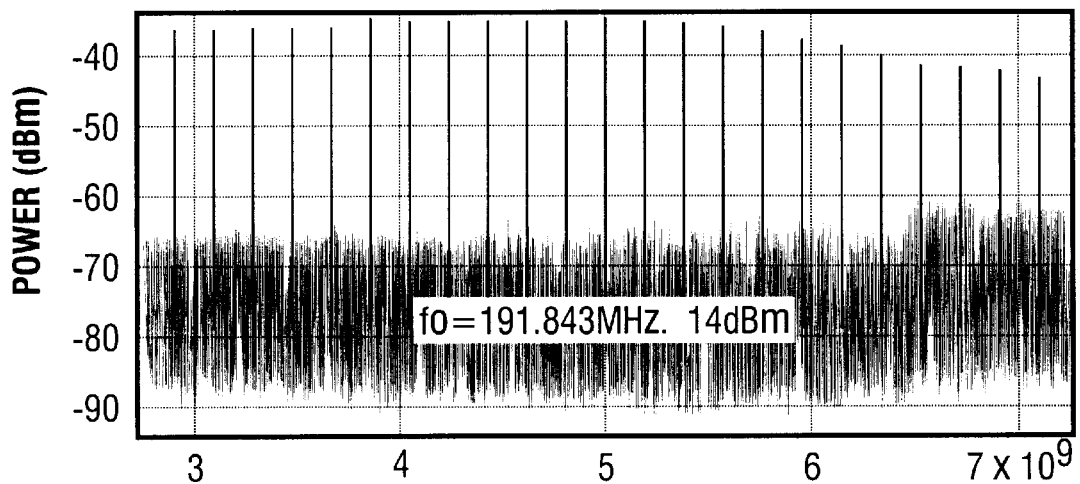
Figure 6C:
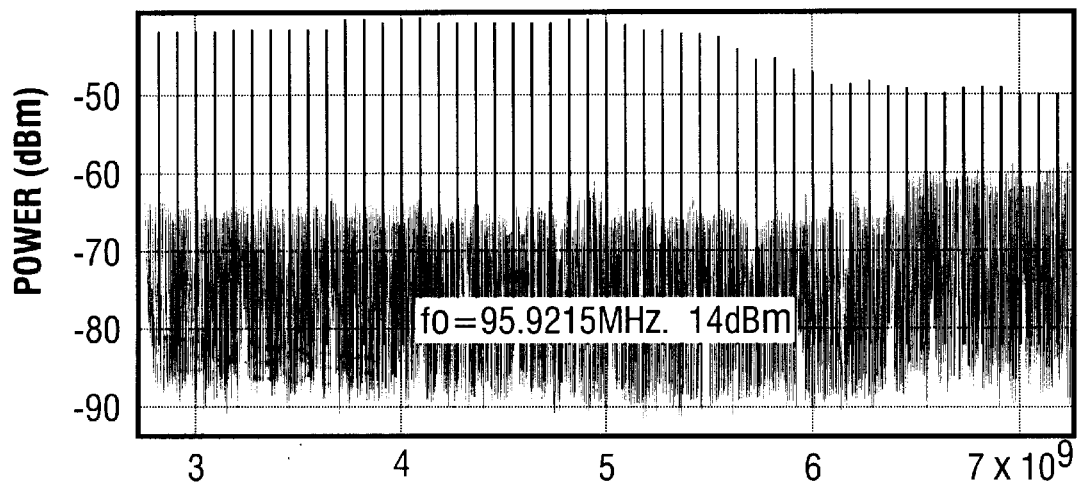

FIGS. 6A–6C further show the mode beating spectra of the mode-locked ring laser 200 at different mode-locking frequencies. It is evident from these measurements that the actual mode spacing of the laser 200 is controlled by the frequency of the RF driving signal 213.

Figure 7:
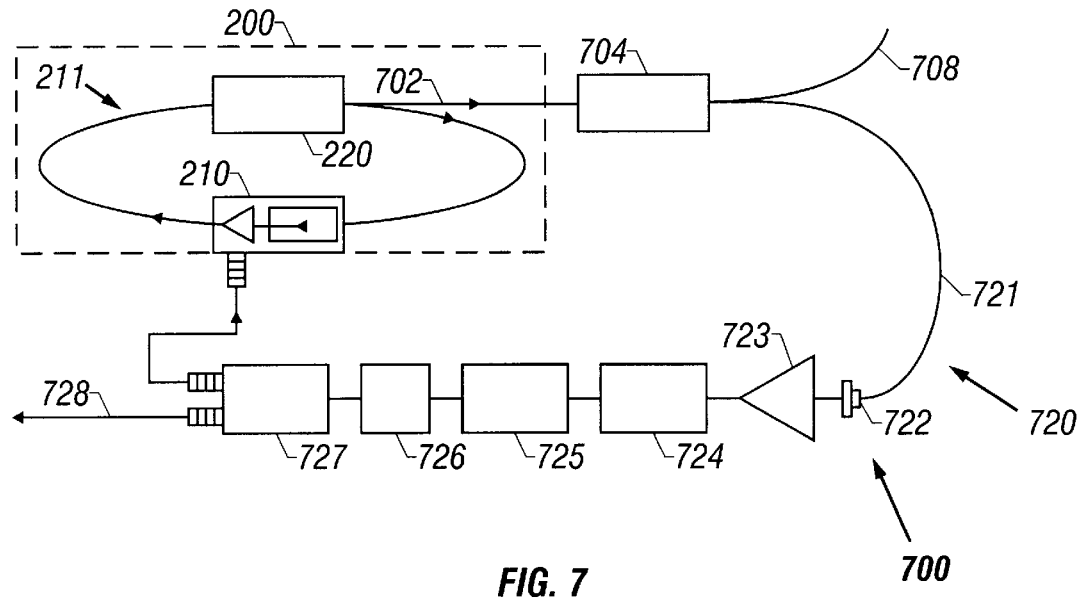
FIG. 7 shows a special COEO in accordance with the present invention.

A special system 700 in accordance with the present invention is shown in FIG. 7. This is one of many possible configurations for the preferred embodiment 100 shown in FIG. 1. The ring laser 200 produces an output 702. An optical coupler 704 couples a portion of output 702 as an optical input 706 to the opto-electronic feedback loop 720 and the remaining power of the output 702 is used as an output 708. For example, the splitting ratio of the coupler 704 may be 90 to 10 with 90% of the total power in the output 702 being fed into the opto-electronic loop 720 and 10% of the total power as the output 708.

The opto-electronic loop 720 includes an optical fiber section 722 as the optical delay element, a detector 721 for converting optical signal to electrical signal, an RF amplifier 723 and a variable attenuator 726 for adjusting the loop gain, a variable RF delay element 724 for phase adjustment, an RF bandpass filter 725 for mode selection and frequency tuning, and an optional RF coupler 727 for generating an RF output 728 or coupling an external RF modulation signal into the loop 720 (not shown). The output signal from the loop 720 is used as the electrical modulation signal 213 which controls the gain of SOA 210.

Alternatively, the loop gain in the opto-electronic loop 720 may be adjusted by an optical element in the loop, including but not limited to, a variable optical attenuator and/or a semiconductor optical amplifier/absorber. The phase delay in opto-electronic loop 720 may also be adjusted with an optical element such as a fiber stretcher installed in the fiber 721.

In operation, optical signal 706 (e.g., 90% of the output 702) is detected by a photo detector 722 and amplified by an RF amplifier 723. The amplified signal then goes through a variable delay line 724, an RF bandpass filter 725, an RF variable attenuator 726, and finally an RF coupler 727 before being fed back to the RF modulation port of the SOA 210. These elements form an opto-electronic feedback loop 720. When the gain of the loop 720 is larger than unity and the feedback is positive (i.e., in phase), an electro-optical oscillation will start within the loop 720. The RF variable delay line 724 is used to adjust the loop length and thereby to change the frequency of the RF oscillation. The variable attenuator 726 is used to adjust the loop gain.

Figure 8A:
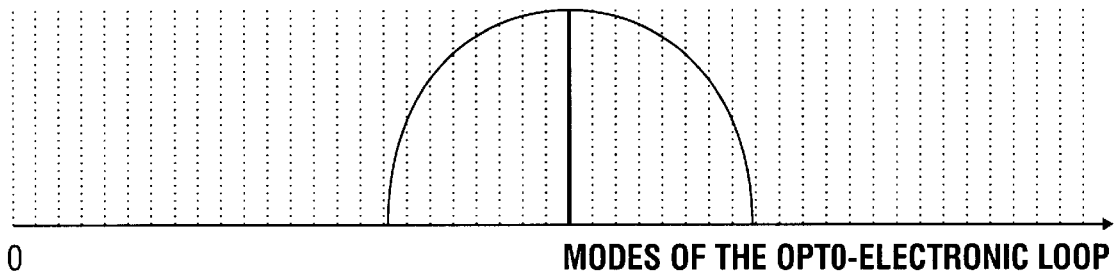
FIGS. 8A and 8B respectively show possible oscillating modes defined by the opto-electronic loop and modal beating spectrum of the laser of an COEO in accordance with the present invention.
Figure 8B:
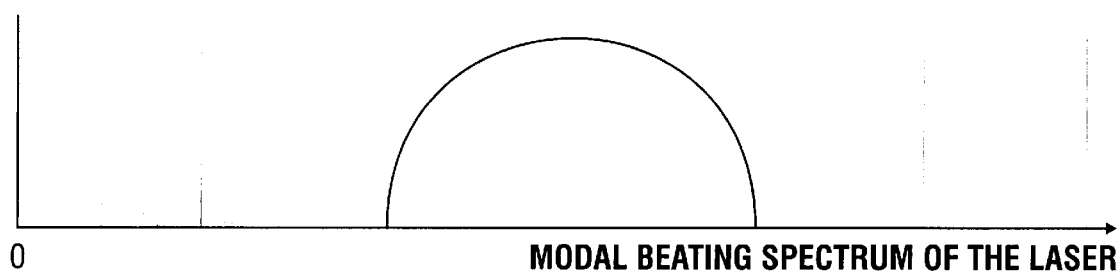

The delay of the opto-electronic feedback loop 720 is preferably much larger than the loop length 211 of the ring laser 200, resulting in a corresponding mode spacing much smaller than the mode spacing of the ring laser 200. For example, the fiber in the optical loop 211 may be a few meters while the fiber in the opto-electronic loop 720 may be over 100 m or even many kilometers. This desirable condition is illustrated in FIGS. 8A and 8B. The center frequency of the RF bandpass filter 725 is chosen such that it is substantially equal to an RF beat frequency of different modes of the ring laser 200. The preferred bandwidth of the filter 725 is chosen to be narrower than the spacing of the beat frequencies which is equivalently the mode spacing of the ring laser 200. Within the passband of the RF filter 725, many OEO modes compete with one another in order to oscillate. However, the dominant mode has a frequency closest to a beat frequency of the laser's longitudinal modes. This is because only this OEO mode can obtain energy from the laser and then effectively mode lock the ring laser 200.

The above desired condition may be achieved by adjusting the relative phase delay between the optical loop 211 and the opto-electronic loop 720. A correlation between the optical loop length and the loop length of the opto-electronic loop is desirable in order to achieve stable oscillations in both loops and mode-lock the optical loop. In the special system 700 in FIG. 7, the relative phase delay between the two feedback loops can be adjusted with the RF variable delay 724. In general, this may be accomplished in a number of ways. For example, a variable phase delay element in the optical loop 211 and/or an optical delay element such as a fiber stretcher in the optical loop section 721 may be used. The relative phase delay between the two loops is so adjusted that one of the RF oscillation modes in the opto-electronic loop is close to or overlaps with a mode beat frequency of the optical loop.

When the laser 200 is mode locked, the beating between any two neighboring modes will add in phase to provide a frequency equal to the frequency of the oscillation mode of OEO. This reinforces the OEO mode that locks the ring laser 200. The mode spacing of the mode-locked laser is equal to the oscillation frequency of the OEO in the opto-electronic loop 720 and is a multiple of the natural mode spacing of the laser 200.

One aspect of the COEO in accordance with the invention is that the optical oscillation and the opto-electronic oscillation are interleaved with each other. As the oscillating opto-electronic loop 720 with a filter 725 centered at a RF frequency $f_m$ mode-locks the laser 200, the optical input signal 706 to the opto-electronic loop 720 will further reinforce the RF oscillation in the opto-electronic loop 720 at the RF frequency $f_m$ which is initially set by the RF filter 725. Therefore, the oscillations in the two different loops, the optical loop and the opto-electronic loop, will interact with each other and stabilize one another.

Figure 9A:
FIGS. 9A, 9B, 9C, 9D, and 9E are charts showing how the optical feedback loop and the opto-electronic loop affect each other in mode coupling and mode locking.
Figure 9B:
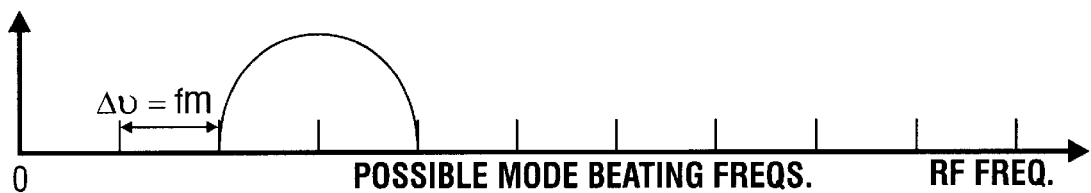
Figure 9C:
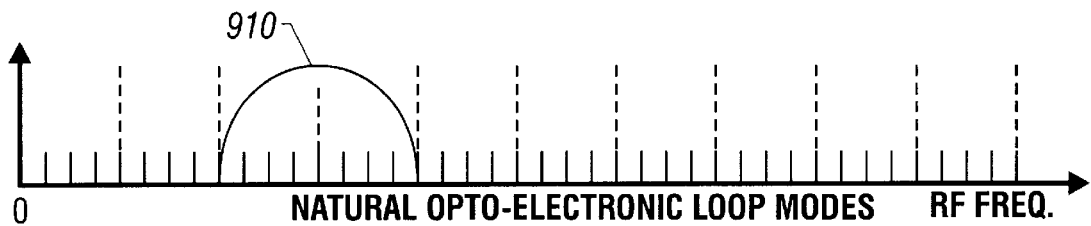
Figure 9D:
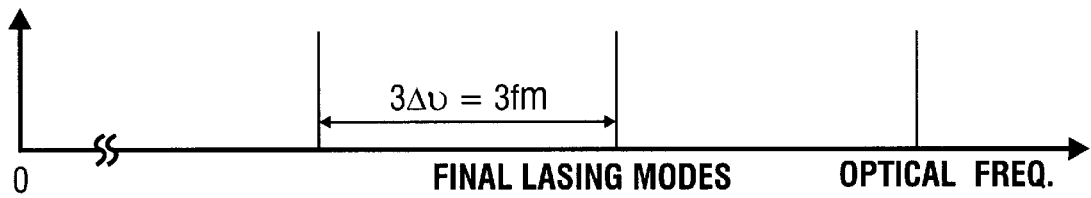

FIGS. 9A–9E show another example illustrating how the modes of the optical loop and the opto-electronic loop affect one another. FIG. 9A shows the permissible laser cavity modes in the optical frequency spectrum in the optical loop. FIG. 9B shows possible mode beating frequencies in the RF frequency spectrum. Note that the mode spacing of the laser cavity modes in the optical spectrum is equal to the mode spacing the of RF beating frequencies in the RF spectrum although their absolute frequencies are different. FIG. 9C shows the possible RF oscillation modes in the RF spectrum in the opto-electronic loop. The RF modes in resonance with the possible mode beating frequencies shown in FIG. 9B, as indicated by the dashed lines, are the modes that oscillate and compete with one another in the opto-electronic loop.

Figure 9E:
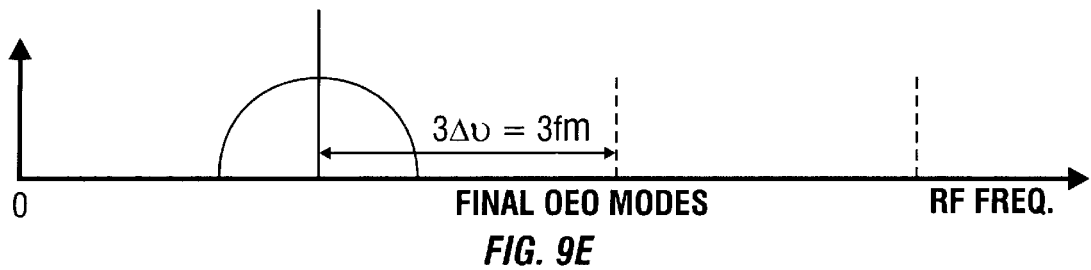

To select a single RF mode to oscillate, the RF bandpass filter 725 is used to suppress all but one RF mode that is closest to the center frequency of the filter 725. This insures the single-mode oscillation in the opto-electronic loop. Referring to FIG. 9C, the center frequency of the RF filter 725 with a bandwidth less than fm is tuned to the third RF mode resonant with the mode beating frequencies at an absolute frequency $3f_m$. Thus, a single RF mode at $3f_m$ will oscillate and modulate the optical loop as shown in FIG. 9E. This RF modulation at $3f_m$ promotes the mode-locking in the optical loop shown in FIG. 9D wherein many optical modes are phase-locked into discrete modes separated by $3f_m$. Because these optical modes are in phase, the beats between them constructively add with one another in phase. This action results in an increase in the signal gain to the RF mode beating signal at $3f_m$.

A series of measurements were performed to evaluate the performance of the special COEO system 700. In one group of measurements, a bandpass filter centered at 300 MHZ with a bandwidth of 13 MHZ was used in the opto-electronic loop 720. Also, the fiber in the ring laser was about 5 m and the fiber in the opto-electronic loop was about 100 m.

Figure 10A:
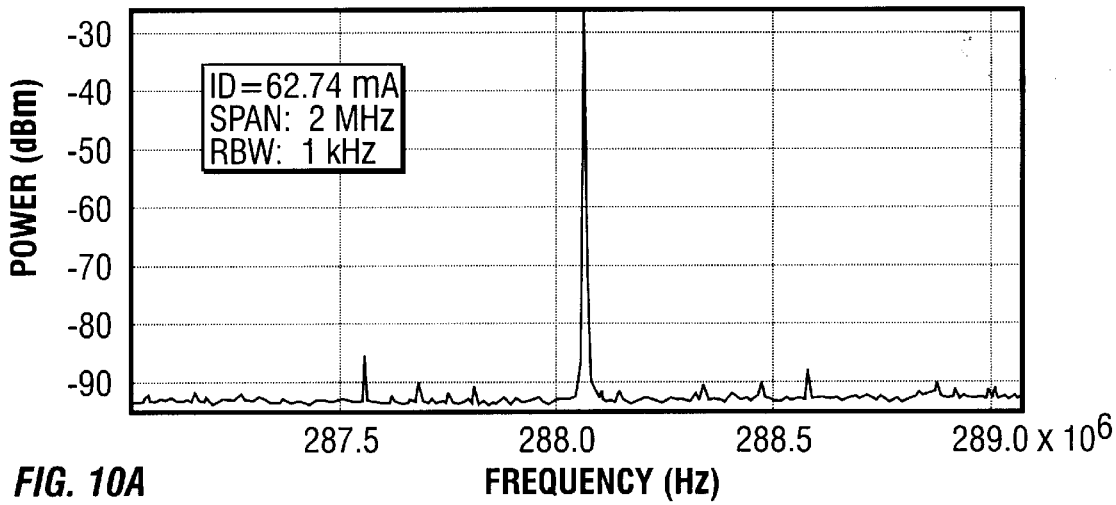
FIGS. 10A, 10B, and 10C show the spectrum of the RF signal in the special system of FIG. 7 with a band pass filter centered at 300 MHZ with a bandwidth of 13 MHZ in the opto-electronic loop.
Figure 10B:
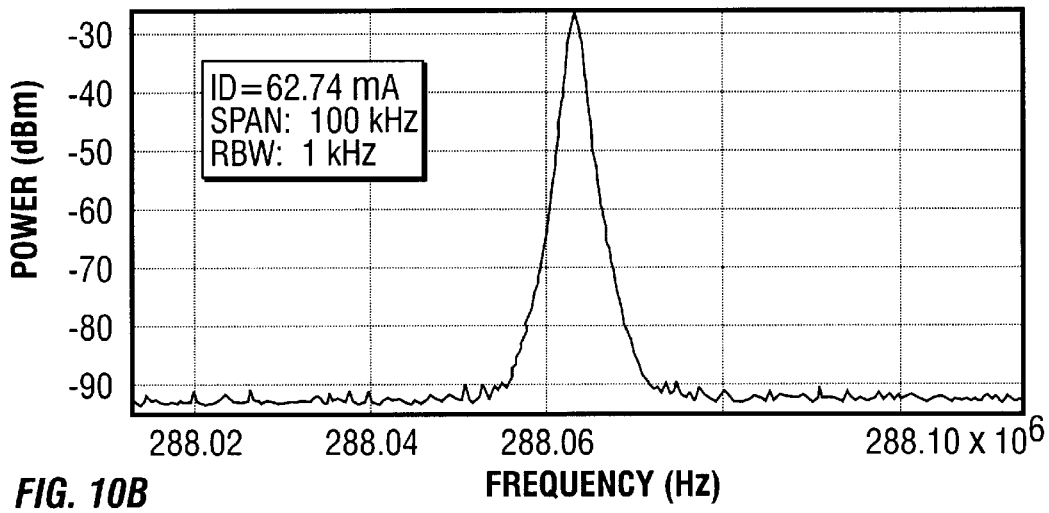
Figure 10C:
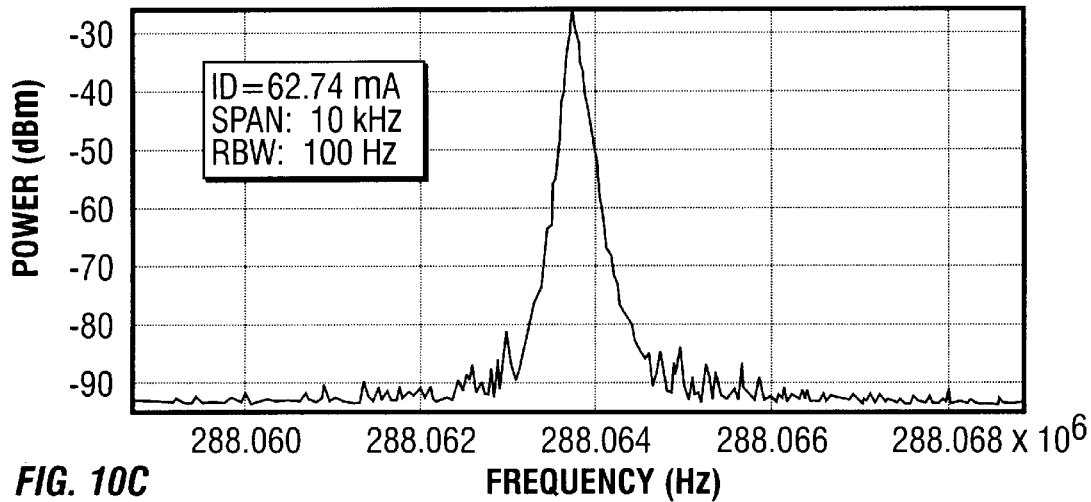

FIGS. 10A–10C show the RF spectrum of the RF oscillation signal 728 measured at the RF output port with decreased frequency window span and increased frequency resolution. A fairly clean signal at 288 MHZ with a power of −30 dBm is evident. Taking the −35 dB coupling ratio of the RF coupler into account, the RF signal circulating in the loop 720 is about 5 dBm, which is limited by the particular RF amplifier 723 used in the special system 700.

Figure 11:
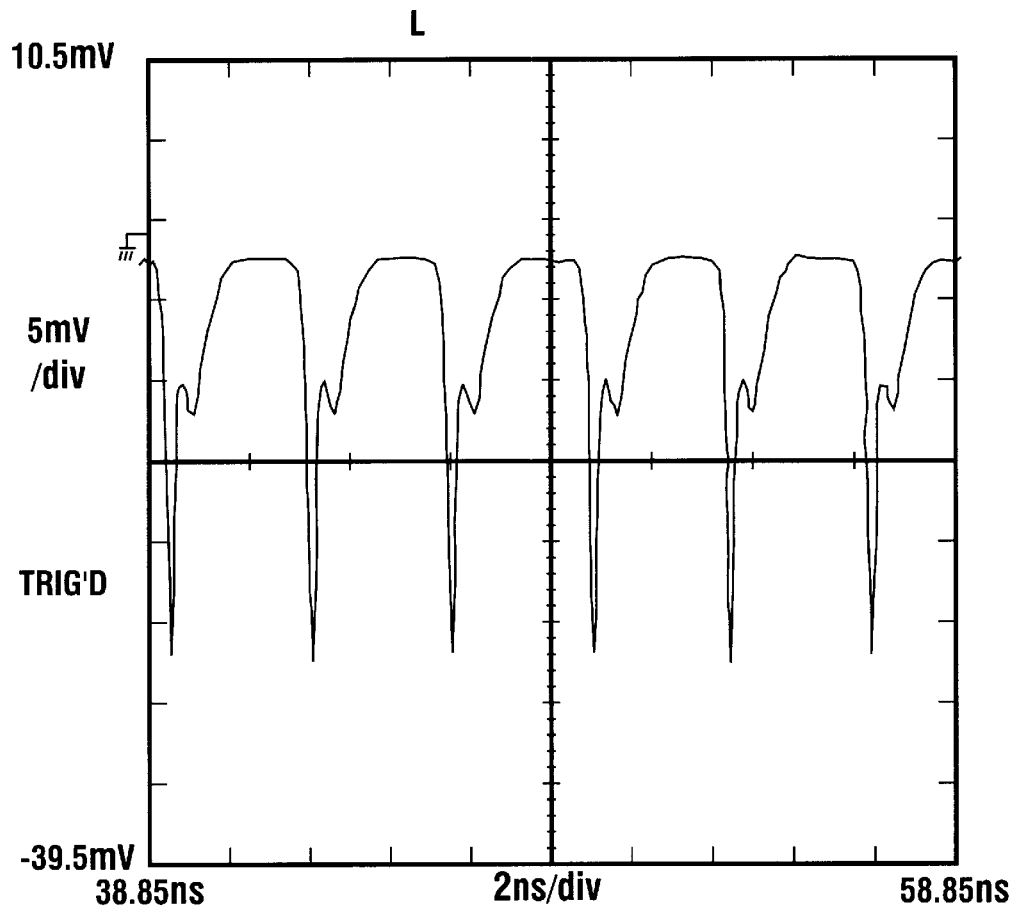
FIG. 11 shows the optical pulse generation in the special system of FIG. 7 with a band pass filter centered at 300 MHZ with a bandwidth of 13 MHZ in the opto-electronic loop.
Figure 12A:
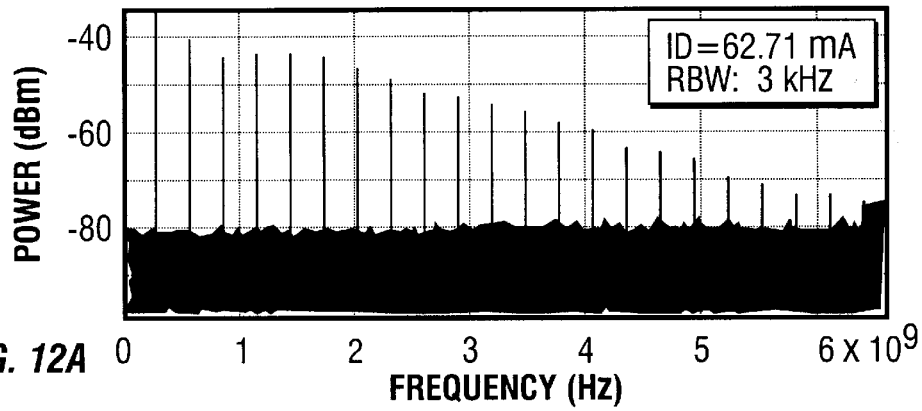
FIGS. 12A, 12B, 12C, and 12D show the spectrum of the optical signal in the special system of FIG. 7 with a band pass filter centered at 300 MHZ with a bandwidth of 13 MHZ in the opto-electronic loop.
Figure 12B:
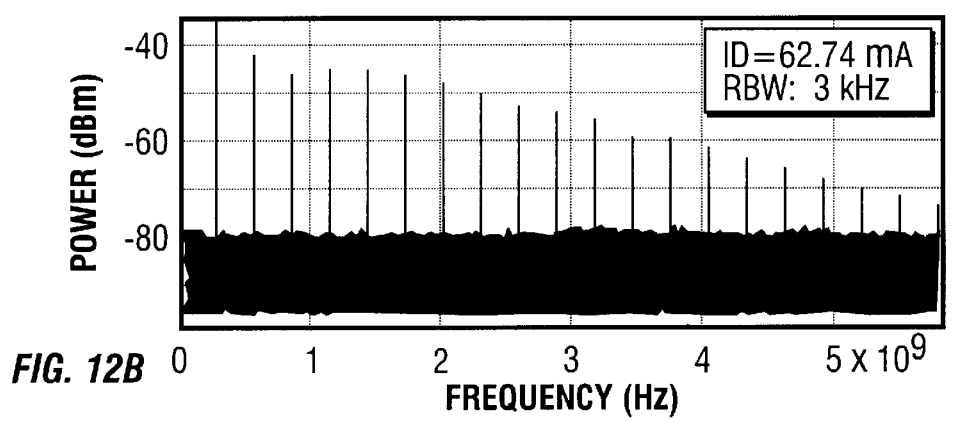
Figure 12C:
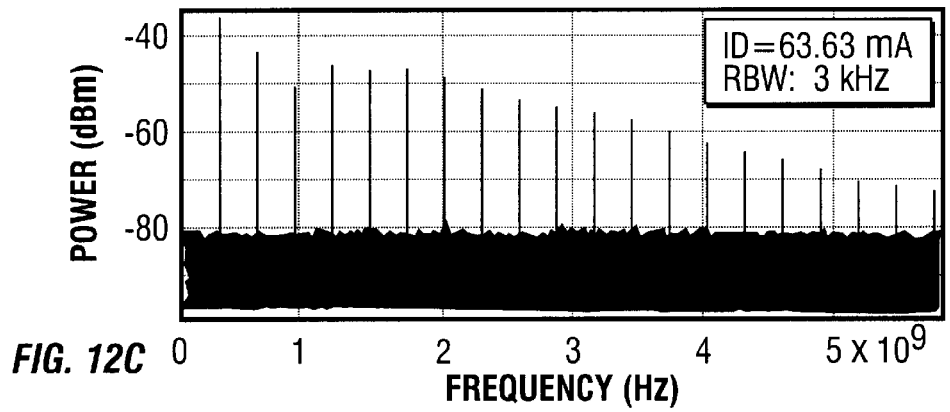
Figure 12D:
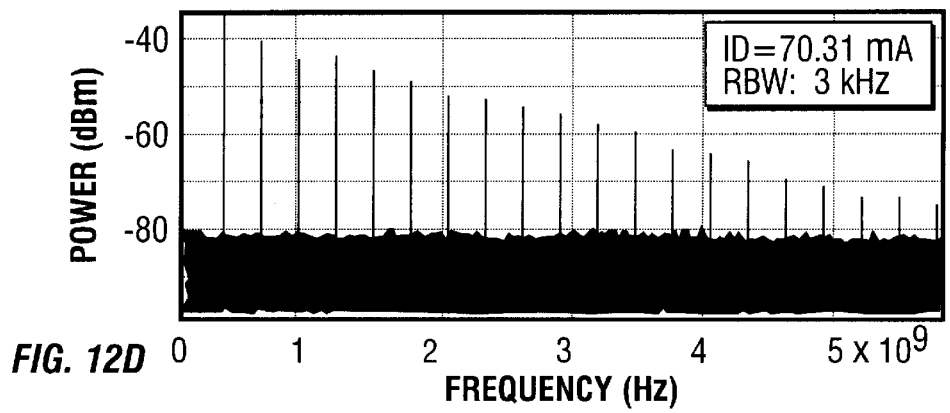
Figure 13A:
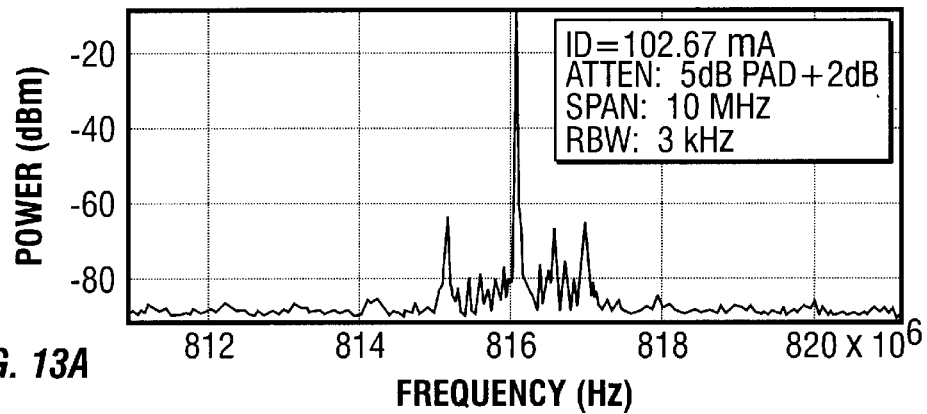
FIGS. 13A, 13B, 13C, and 13D show the spectrum of the RF signal in the special system of FIG. 7 with a band pass filter centered at 800 MHZ with a bandwidth of 40 MHZ in the opto-electronic loop.
Figure 13B:
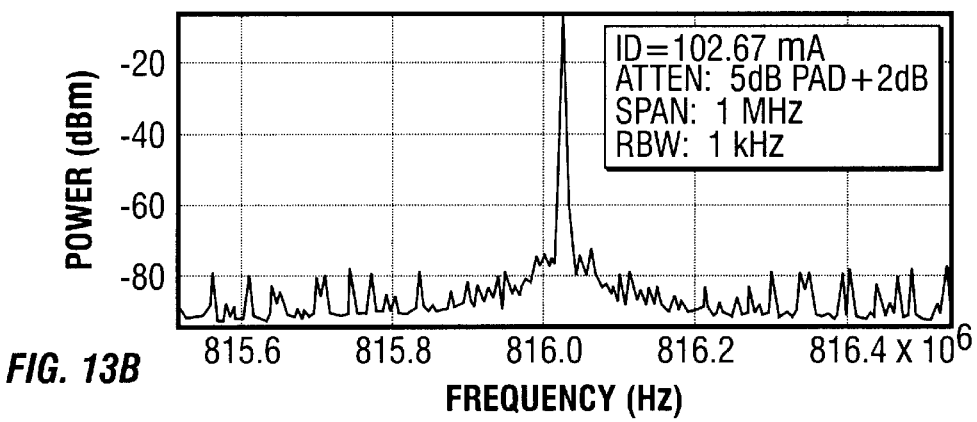
Figure 13C:
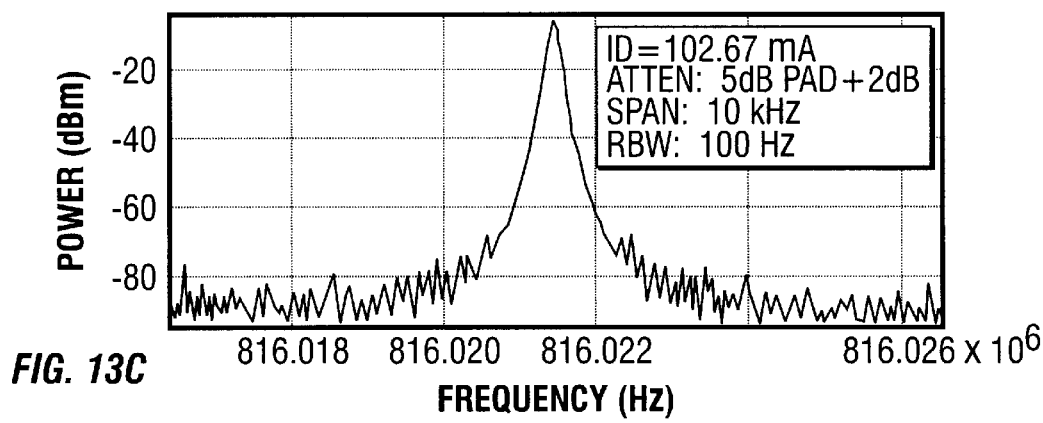
Figure 13D:
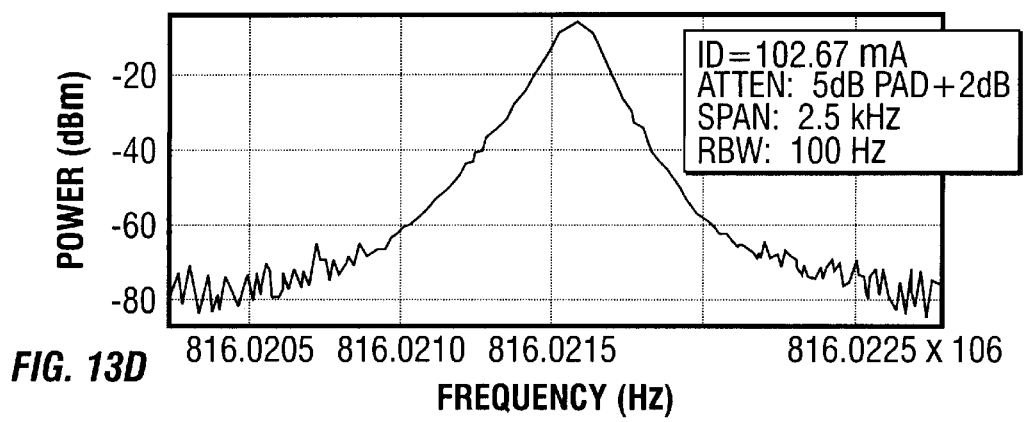

The ring laser 200 was also automatically mode locked by this self-generated RF signal in the loop 720 to produce a train of short optical pulses, as shown in FIG. 11. The pulse width is about 250 ps while the periodicity of the pulses is about 3.6 ns. A HP CSA803 communication signal analyzer was used to obtain the data of FIG. 11.

The mode beating spectrum of the mode locked laser 200 is shown in FIGS. 12A–12D. It was measured at output 708 with a Lasertron photo detector with a bandwidth of 18 GHz and a HP 8562A spectrum analyzer. It can be inferred from the spectrum that about 20 modes of the ring laser 200 were mode-locked.

In other measurements, an RF bandpass filter centered at 800 MHZ with a bandwidth of 40 MHZ was used to replace the above 300 MHZ filter. This allows the special COEO 700 to oscillate at about 800 MHZ. The oscillating RF signal fed to the SOA 210 in turn mode locks the ring laser 200. The spectrum of the RF signal is shown in FIGS. 13A–13D with decreased frequency span and increased frequency resolution. It is evident from FIGS. 13C and 13D that an RF signal with a high spectral purity was obtained with the COEO.

Figure 14:
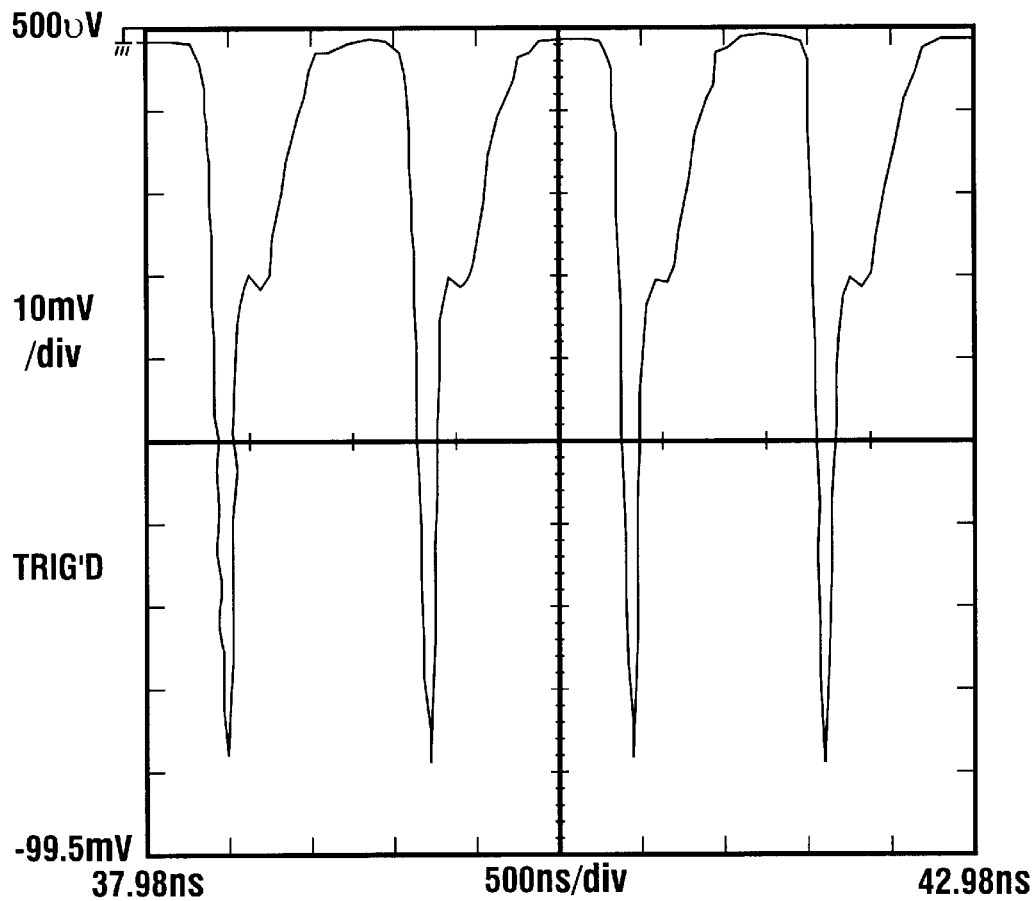
FIG. 14 shows the optical pulse generation in the special system of FIG. 7 with a band pass filter centered at 800 MHZ with a bandwidth of 40 MHZ in the opto-electronic loop.

The corresponding pulse train of the mode locked ring laser 200 is shown in FIG. 14. It can be seen form FIG. 14 that the pulse width is about 50 ps and periodicity of the pulse train is about 1.2 ns. In comparison with FIG. 11 for a 300 MHz filter, pulse width is greatly shortened with the increase of the oscillation frequency.

It should be noted that the mode locked laser and the OEO were both very stable and they did not seem to change during many hours of operation. This is, at least in part, due to the self-correcting mechanism of the coupled oscillation.

The inventors believe that the absolute frequency of a laser mode and the generated RF frequency in the preferred embodiment 100 of COEO are related. A stable RF oscillation will stabilize every longitudinal mode of the laser and the stable longitudinal modes of the laser in turn improves the stability of the oscillating RF signal. This may be further understood by examining the following two ideal cases.

In a first ideal case, the longitudinal modes of the laser are assumed to be perfectly stable. In this case the beat signals between any two neighboring modes have exactly the same frequency and add up in phase. This beat signal provides a strong gain to an OEO oscillation of the same frequency. This OEO oscillation will remain dominating even when the opto-electronic loop length is changed to favor other oscillation frequency. As a result, the OEO oscillation frequency is stabilized by the laser frequency against the loop length fluctuations of the opto-electronic loop.

In a second ideal case, the RF OEO oscillation is assumed to be perfectly stable. With this OEO oscillation signal driving the multimode laser, the mode spacing will be fixed by the RF OEO signal. This is because both the absolute frequency of each mode m ($f_m=mc/nL$, where n is the refractive index and L is the round trip cavity length and m is an integer) and the mode spacing ($\Delta f=c/nL$) of the neighboring modes are inversely proportional to the effective laser cavity length. One cannot change the absolute frequency of each mode without changing the mode spacing. Therefore, when the mode spacing is stabilized by the OEO oscillation, the absolute frequency of each laser modes is also stabilized. Taking the derivative of the mode frequency and the mode spacing result in the following:

$$df_m = -m[c/(nL)][d(nL)/(nL)] = -\Delta f[d(nL)/(nL)], \quad (4)$$

$$d(\Delta f) = -(c/nL)[d(nL)/(nL)] = -\Delta f[d(nL)/(nL)], \quad (5)$$

$$df_m = m\, d\,(\Delta f) = (f_m/\Delta f)\, d(\Delta f). \quad (6)$$

Eq. (6) indicates that any mode spacing fluctuation will cause a larger mode frequency fluctuation with a multiplication factor of $(f_m/\Delta f)$. This is the exact same relation as in frequency multiplication of any scheme. Note that Eq. (6) is simple but extremely important because it establishes a link between the stability of an RF oscillation and an optical modulation.

However, the dispersion of the laser material in the laser cavity may limit the effectiveness of the mutual stabilization of the optical modulation and opto-electronic oscillation. Because of the dispersion, mode spacing will change as a function of mode frequency. Therefore, the maximum number of modes that will be mode locked will be determined by the dispersion. It is possible that several groups of modes co-exist in the laser cavity and the modes within each group are phase locked. However, the phase relations among the groups are random or partially random and may add noise to the OEO and the optical oscillation. Therefore, dispersion compensation in the laser cavity may be needed.

Although the present invention has been described in detail with reference to a preferred embodiment, one ordinarily skilled in the art to which this invention pertains will appreciate that various modifications and enhancements may be made without departing from the scope and spirit of the present invention.

For example, an COEO may also be constructed with a multimode diode laser having a Fabry-Perot cavity in accordance with the preferred embodiment 100 of FIG. 1. This is illustrated by FIG. 15A. A diode laser 1502 has a large mode spacing because of the extremely short cavity length of a Fabry-Perot cavity 1504 (e.g., mode spacing can be on the order of 50 GHz). Using such a laser to construct an COEO, a high frequency oscillation can be obtained. Because of the resonance enhancing, modulation of the laser at the mode spacing frequency can be very efficient if the impedance of the laser is matched with the source. FIG. 15B shows the modulation efficiency as a function of the modulation frequency. This resonance peak can effectively act as an RF filter to eliminate the need of using a bulky RF filter in the opto-electronic loop 1510. The resulting COEO based on this embodiment can be made compact and efficient. This system is capable of generating stable high frequency RF oscillation and ultrashort optical pulses. Nagarajan et al. describe the modulation of a diode laser at an RF frequency in "Resonantly Enhanced Semiconductor Lasers for Efficient Transmission of Millimeter Wave Modulated Light", IEEE Photonics Technology Letters, Vol. 5, No. 1, January, 1993.

The direct current modulation often introduces a frequency chirp on a laser's frequency spectrum. This chirp may produce some unwanted effects that may degrade the performance of the COEO. To eliminate the frequency chirp, an electro-absorption modulator 1610 may be integrated into a laser cavity 1620 containing a semiconductor gain medium 1622. This is shown in FIG. 16. The modulation of the laser can be done by driving the modulator 1610 with an electrical signal (e.g., a voltage source). The laser can be resonantly modulated with a modulation peak at the mode spacing frequency which effectively functions as a bandpass filter. With such a laser to construct a COEO, better frequency stability and even shorter optical pulses can be achieved.

Variable optical delay elements can also be used in the opto-electronic loop. The phase delay of the optical feedback in the laser can also be changed by, for example, inserting phase delay elements in the laser cavity. This phase change in the laser cavity can be used to perform coarse frequency tuning for the RF oscillation in the opto-electronic loop of the preferred system 100 shown in FIG. 1.

Furthermore, the laser 102 of the preferred system 100 may be optically pumped by an external light source such as a laser or a flash lamp. An electro-optical element, such as a semiconductor optical amplifier or an electro-absorption modulator, can be inserted in the optical feedback loop of the laser to modulate characteristics of the laser (e.g., gain or phase) based on the electrical modulation signal 124.

These variations and other modifications are intended to be encompassed by the follow claims.

What is claimed is:

1. An opto-electronic device, comprising:
   a laser, having an internal active optical feedback loop with a first loop gain greater than unity and responsive to an electrical modulation signal, said laser operating to produce a coherent optical oscillation; and
   an opto-electronic feedback loop with a second loop gain greater than unity, receiving an optical signal indicative of said optical oscillation and converting said optical signal into said electrical modulation signal having a relation with said optical oscillation, said electrical modulation signal affecting said optical loop and said optical oscillation.

2. A device as in claim 1, wherein said electrical modulation signal in said opto-electronic feedback loop causes an optical modulation in said optical oscillation in said laser.

3. A device as in claim 2, wherein said optical modulation is in phase with said optical oscillation in said laser and causes mode-locking of said optical oscillation in said laser.

4. A device as in claim 1, wherein said electrical modulation signal modulates said first loop gain or a phase of said optical feedback loop.

5. A device as in claim 1, wherein said laser includes a gain medium in said optical feedback loop, said gain medium having a gain that varies with said electrical modulation signal.

6. A device as in claim 5, wherein said laser has a ring cavity.

7. A device as in claim 6, wherein said laser includes an optical fiber in said ring cavity to provide a conduit for said laser oscillation.

8. A device as in claim 6, wherein said gain medium comprises a semiconductor optical amplifier.

9. A device as in claim 5, wherein said laser includes a semiconductor laser.

10. A device as in claim 9, wherein said gain medium includes:
    a semiconductor laser medium that is driven by a laser power supply, operable to cause laser oscillation; and
    an electro-absorption modulator, disposed in said optical feedback loop of said semiconductor laser, said electro-absorption modulator receiving said electrical modulation signal to change optical absorption thereof, thus resulting in a change in said first loop gain.

11. A device as in claim 1, wherein said optical feedback loop and said opto-electronic feedback loop have a phase correlation with respect to each other.

12. A device as in claim 1, further comprising a phase delay element in said laser, operating to change a phase of said optical oscillation and to affect said electrical modulation signal.

13. A device as in claim 12, wherein a frequency of said electrical modulation signal is affected by said phase delay element in said laser.

14. A device as in claim 2, further comprising an optical coupler disposed relative to said laser, said optical coupler operable to split an output of said laser into a first portion as laser output and a second portion as said optical signal for feeding said opto-electronic loop.

15. A device as in claim 2, wherein said opto-electronic feedback loop further comprises an photodetector responsive to said optical signal, said photodetector deployed relative to said laser and operable to convert said optical signal into said electrical modulation signal.

16. A device as in claim 15, wherein said opto-electronic feedback loop further comprises an RF amplifier.

17. A device as in claim 15, wherein said opto-electronic feedback loop further comprises a variable RF delay element for changing a phase of said opto-electronic feedback loop.

18. A device as in claim 15, wherein said opto-electronic feedback loop further comprises an RF bandpass filter for changing a frequency characteristic of said electrical modulation signal.

19. A device as in claim 15, wherein said opto-electronic feedback loop further comprises a variable RF attenuator for changing said second loop gain.

20. A device as in claim 15, wherein said opto-electronic feedback loop further comprises an RF coupler.

21. A device as in claim 20, wherein said RF coupler couples an external RF modulation signal into said opto-electronic feedback loop.

22. A device as in claim 20, wherein said RF coupler generates an RF output.

23. A device as in claim 15, wherein said opto-electronic feedback loop further comprises an optical delay line.

24. A device as in claim 23, wherein said optical delay line includes an optical fiber.

25. A device as in claim 23, wherein said optical delay line includes a variable optical phase delay element.

26. A device as in claim 25, wherein said optical delay line includes a variable optical attenuator.

27. A device as in claim 1, wherein said laser further includes an external optical light source to supply power to said optical oscillation.

28. A device as in claim 1, wherein said optical oscillation in said laser is energized by an electrical power supply.

29. A device as in claim 1, wherein said laser is a multi-mode laser.

30. A device as in claim 5, wherein said laser has a Fabry-Perot cavity.

31. An opto-electronic device, comprising:

an active optical feedback loop configured to have a first loop gain greater than unity and operable to produce a laser oscillation therein, said optical loop having an electro-optical element operable to affect said first loop gain; and an opto-electronic feedback loop having a second loop gain greater than unity and being coupled with said optical loop, said opto-electronic loop including a photodetector that receives an optical signal indicative of said laser oscillation in said optical loop and produces an electrical modulation signal, wherein said electrical modulation signal is fed into said electro-optical element in said optical loop to couple said optical loop and said opto-electronic loop with each other.

32. A device as in claim 31, wherein said optical loop comprises a first optical fiber loop.

33. A device as in claim 32, wherein said electro-optical element is a semiconductor optical amplifier that is optically coupled to said first optical fiber loop and is electrically connected to said opto-electronic loop to receive said electrical modulation signal, said semiconductor optical amplifier having a gain that is modulated by said electrical modulation signal.

34. A device as in claim 32, wherein said first optical fiber loop includes an optical phase delay element.

35. A device as in claim 31, wherein said opto-electronic loop comprises a second optical fiber loop having one end that is optically coupled to said optical loop for receiving said optical signal and another end that is connected to said photodetector, said second optical fiber loop effecting a delay in said opto-electronic loop.

36. A device as in claim 35, wherein said second optical fiber loop includes an fiber stretcher for changing a phase delay in said opto-electronic loop and tuning a modulation frequency of said electrical modulation signal.

37. A device as in claim 35, wherein said second optical fiber loop includes a variable optical attenuator to change said second loop gain.

38. A device as in claim 31, wherein said opto-electronic feedback loop further comprises an RF amplifier.

39. A device as in claim 31, wherein said opto-electronic loop further comprises a variable RF delay element operable to change a phase of said opto-electronic loop.

40. A device as in claim 31, wherein said opto-electronic loop further comprises an RF band-pass filter operable to change a frequency characteristic of said electrical modulation signal.

41. A device as in claim 31, wherein said opto-electronic loop further comprises a variable RF attenuator operable to change said second loop gain.

42. A device as in claim 31, wherein said opto-electronic loop further comprises an RF coupler.

43. A device as in claim 31, wherein said optical feedback loop and said opto-electronic feedback loop has a phase correlation with respect to each other.

44. An opto-electronic device, comprising:

an active optical feedback loop with a first loop gain greater than unity and a first loop delay, said optical loop operable to generate a laser oscillation therein and having an electro-optical gain element that is operable to affect said first loop gain; and an opto-electronic feedback loop coupled with said optical loop, having a second loop gain greater than unity and a second loop delay greater than said first loop delay, said opto-electronic loop including:

an optical delay line having one end coupled to said optical loop to receive an optical signal indicative of said laser oscillation and another end connected to a photodetector that converts said optical signal into an electrical modulation signal, an RF delay line having one end connected to said photodetector to receive said electrical modulation signal and another end connected to said electro-optical gain element, and an RF bandpass filter connected in said RF delay line, having a center frequency that is substantially equal to a RF beat frequency of different modes of said optical loop, whereby said optical loop is mode-locked to produce pulsed laser oscillations.

45. A device as in claim 44, where in said RF bandpass filter has a bandwidth that is smaller than a mode spacing of said optical loop.

46. A device as in claim 44, wherein said RF delay line comprises an RF amplifier.

47. A device as in claim 44, wherein said RF delay line further comprises a variable RF delay element for changing a phase of said opto-electronic loop.

48. A device as in claim 44, wherein said RF delay line further comprises a variable RF attenuator for changing said second loop gain.

49. A device as in claim 44, wherein said RF delay line further comprises an RF coupler.

50. A device as in claim 44, wherein said first loop delay has a relation with said second loop delay so that one of RF oscillation modes in said opto-electronic loop is substantially in resonance with a mode beat frequency of said active optical feed loop.

51. A method for generating an opto-electronic oscillation, comprising:

providing an active optical feedback loop with a first loop gain greater than unity and responsive to an electrical modulation signal, said optical loop operating to produce a laser oscillation;

providing an opto-electronic loop with a second loop gain greater than unity, said opto-electronic loop having an optical delay line with a photodetector and an RF delay line;

optically coupling said optical delay line of said opto-electronic loop with said optical loop to receive an optical signal indicative of said laser oscillation;

converting said optical signal into said electrical modulation signal with said photodetector, said electrical modulation signal having a relation with said laser oscillation; and electrically coupling said RF delay line with said optical loop to feed said electrical modulation signal to affect said optical loop.

52. A method as in claim 51, wherein said optical feedback loop includes an active semiconductor gain medium formed on a semiconductor substrate and positioned between two reflective surfaces formed on said semiconductor substrate.

53. A method as in claim 52, wherein said optical delay line includes an optical fiber coupled to said semiconductor substrate to receive transmitted light from one of said reflective surfaces.

54. A method as in claim 52, further comprising electrically modulating a portion of said active semiconductor gain medium in response to said electrical modulation signal to produce a gain modulation in said portion, wherein said first loop gain changes with said gain modulation.

55. An opto-electronic device, comprising:

a semiconductor gain medium formed on a substrate and operable to produce an optical gain in response to an electrical excitation signal;

two reflective elements formed on said substrate and spaced from each other to enclose said semiconductor gain medium, one of said reflective elements being partially transmissive to allow transmission of light generated by said semiconductor gain medium, wherein said semiconductor gain medium and said reflective elements form an optical loop which operable to produce a first loop gain greater than unity and to sustain a laser oscillation; and an opto-electronic feedback loop having a second loop gain greater than unity and an optical fiber coupled to said substrate to receive a portion of transmitted light from one of said reflective elements, wherein said opto-electronic loop includes a photodetector coupled to convert light from said optical fiber into an electrical modulation signal, wherein said electrical modulation signal is applied to said semiconductor gain medium to modulate said first loop gain and to couple said optical loop and said opto-electronic loop with each other.

56. A device as in claim 55, wherein said semiconductor gain medium comprises at least:

a first gain section connected to receive said electrical modulation signal from said opto-electronic feedback loop and produce a variable gain in response to said electrical modulation signal, thereby effecting an electro-absorption modulator; and a second gain section that has a section optical gain that is substantially independent of said electrical modulation signal.

57. A device as in claim 55, wherein said opto-electronic feedback loop comprises an electronic signal amplifier connected to amplify said electrical modulation signal.

* * * * *